United States Patent [19]
Miyake et al.

[11] Patent Number: 5,886,912
[45] Date of Patent: Mar. 23, 1999

[54] PROCESSING ELEMENTS CONNECTED IN CASCADE HAVING A CONTROLLABLE BYPASS

[75] Inventors: Jiro Miyake; Kazuki Ninomiya; Tamotsu Nishiyama, all of Osaka, Japan

[73] Assignee: Matsushita Electric Industrial Co., Ltd., Osaka, Japan

[21] Appl. No.: 557,316

[22] Filed: Nov. 14, 1995

[30]     Foreign Application Priority Data

Nov. 15, 1994  [JP]  Japan ..................................... 6-280247

[51] Int. Cl.⁶ .................................................. G06F 17/10
[52] U.S. Cl. .................................. 364/724.01; 364/724.13
[58] Field of Search ....................... 364/724.01, 724.16, 364/724.13, 724.1, 723, 736

[56]              References Cited

U.S. PATENT DOCUMENTS

| 4,835,725 | 5/1989 | Yassaie et al. ............................ 364/736 |
| 5,177,698 | 1/1993 | Parulski ................................... 364/723 |
| 5,383,145 | 1/1995 | Sakiyama et al. .................. 364/724.16 |

FOREIGN PATENT DOCUMENTS

| 58-162120 | 9/1983 | Japan . |
| 6-013843  | 1/1994 | Japan. |

OTHER PUBLICATIONS

C. Joanblang et al., "A 54–MHz CMOS Programmable Video Signal Processor for HDTV Applications", IEEE Journal of Solid–State Circuits, Jun. , 1990, vol. 25, No. 3, pp. 730–734.

*Primary Examiner*—Tan V. Mai
*Attorney, Agent, or Firm*—McDermott, Will & Emery

[57]             ABSTRACT

A plurality of processing elements are connected in cascade so as to constitute a single signal processing apparatus. The signal processing apparatus has a first path for transferring an input data signal and a second path for transferring a processing result of the input data signal. Each of the processing elements has a first input disposed on the first path, a data holding circuit for holding the data signal supplied through the first input, a product-sum circuit for executing a product-sum operation between the data signal held in the data holding circuit and another data signal, a second input disposed on the second path so as to supply the other data signal to the product-sum circuit, a result register for holding the result of the operation calculated by the product-sum circuit and supplying the held result of the operation to the second path, an output selecting circuit for supplying either one of the data signal held in the data holding circuit and the result of the operation held in the result register, and a processing control circuit for controlling respective operations of the data holding circuit, product-sum circuit, result register, and output selecting circuit. Since a route extending from the result register to the output selecting circuit forms a bypass from the second path to the first path, a flexible process can be performed by the signal processing apparatus by using or not using the bypass depending on control information.

20 Claims, 13 Drawing Sheets

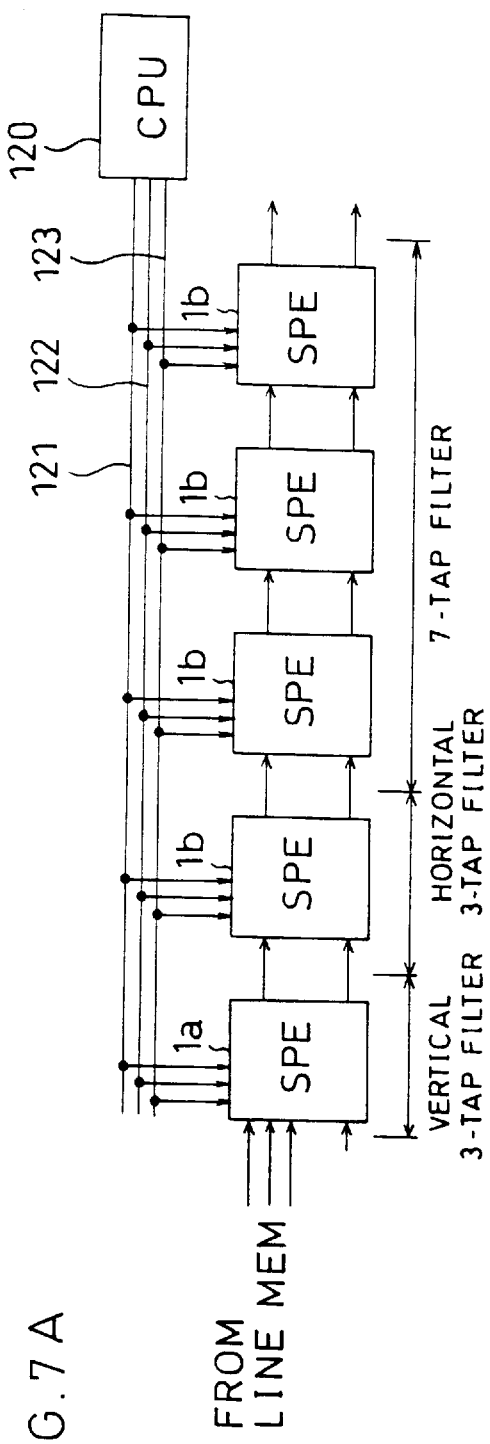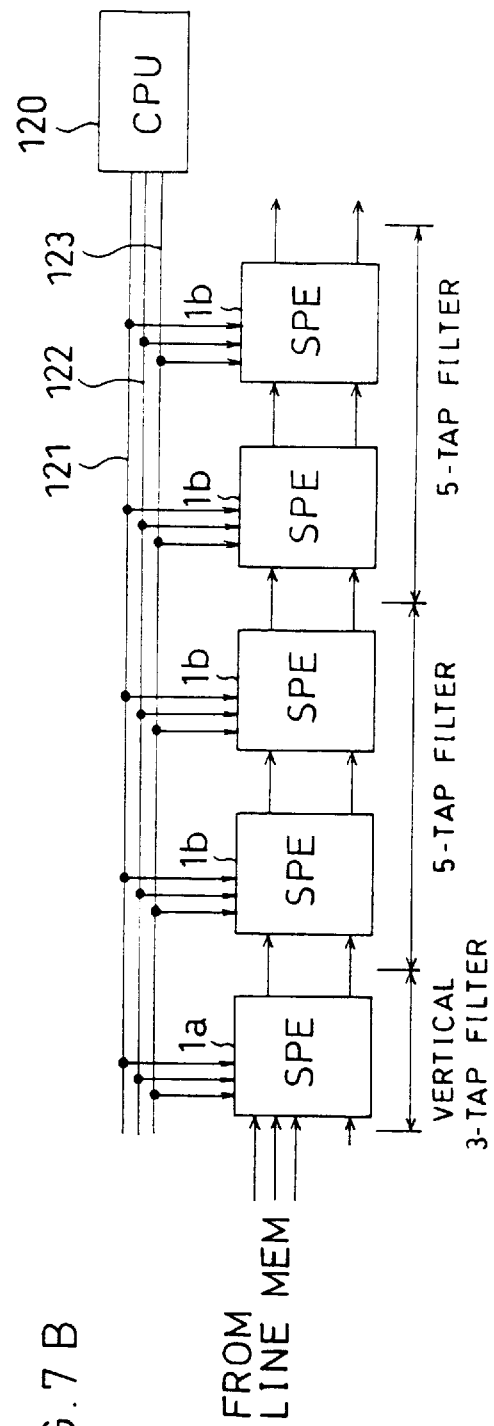

PROCESSING ELEMENTS CONNECTED IN CASCADE HAVING A CONTROLLABLE BYPASS

BACKGROUND OF THE INVENTION

The present invention relates to a signal processing apparatus for performing product-sum operations and, more particularly, to a digital filter.

Japanese Laid-Open Patent Publication SHO 58-162120 has disclosed a signal processing apparatus which functions as a transversal filter. The signal processing apparatus is composed of a plurality of signal processing elements (SPEs) connected in cascade and comprises a first path for transferring an input data signal and a second path for transferring a processing result of the input data signal. Each of the SPEs comprises a first input disposed on the first path and a second input disposed on the second path. Each of the SPEs further comprises: three latches for holding three respective data signals supplied sequentially through the first input; a first selector for sequentially selecting the three data signals held in the three latches; a second selector for sequentially selecting three coefficients in response to the first selector; a multiplier for sequentially calculating respective products of the data signals selected by the first selector and the coefficients selected by the second selector; an accumulator for accumulating the three products obtained in the multiplier; and an adder for calculating a sum of the result of accumulation performed by the accumulator and a data signal supplied through the second input, i.e., a partial sum. The data signal held in the last one of the three latches of each SPE is supplied to the first input of the SPE in the subsequent stage, thereby constituting a shift register on the first path. On the other hand, the data signal representing the partial sum obtained in the adder of each SPE is supplied to the second input of the SPE in the subsequent stage. To implement a 9-tap transversal filter, three SPEs are connected in cascade.

In a television set, it is generally required to perform a sequence of processes, such as a vertical filtering process and a horizontal filtering process to be sequentially performed, with respect to an image data signal. In addition, it is strongly desired to process image data signals in different broadcasting systems by means of a single signal processing apparatus.

However, a signal processing apparatus with the foregoing internal structure in which the plurality of SPEs are connected in cascade has the disadvantage of insufficient flexibility. Once the signal processing apparatus has been formed, the number of taps for a filtering process is fixed depending on the number of the SPEs that have been connected. For example, a signal processing apparatus composed of three SPEs is dedicated to a 9-tap filter and hence cannot function as three sequential 3-tap filters.

SUMMARY OF THE INVENTION

It is therefore an object of the present invention to improve the flexibility of a signal processing apparatus comprising a plurality of processing elements connected in cascade so as to constitute a first path for transferring an input data signal and a second path for transferring a processing result of the input data signal.

To attain the above object, the present invention has provided each of the processing elements with a bypass from the second path to the first path so as to use or not use the bypass depending on control information. Specifically, the present invention has provided each of the processing elements with: a first input disposed on the first path; a data holding circuit for holding a data signal supplied through the first input; an operation circuit for calculating a result of an operation performed between the data signal held in the data holding circuit and another data signal; a second input disposed on the second path so as to supply the other data signal to the operation circuit; a result register for holding the result of the operation calculated by the operation circuit and supplying the held result of the operation to the second path; an output selecting circuit for supplying either one of the data signal held in the data holding circuit and the result of the operation held in the result register to the first path; and a processing control circuit for controlling respective operations of the data holding circuit, the operation circuit, the result register, and the output selecting circuit.

BRIEF DESCRIPTION OF THE DRAWINGS

FIGS. 7A and 7B are block diagrams showing respective extended examples of the signal processing apparatus of FIG. 1;

DETAILED DESCRIPTION OF THE INVENTION

Below, signal processing apparatus according to the embodiments of the present invention will be described with reference to the drawings.

FIRST EMBODIMENT

Figure 1:
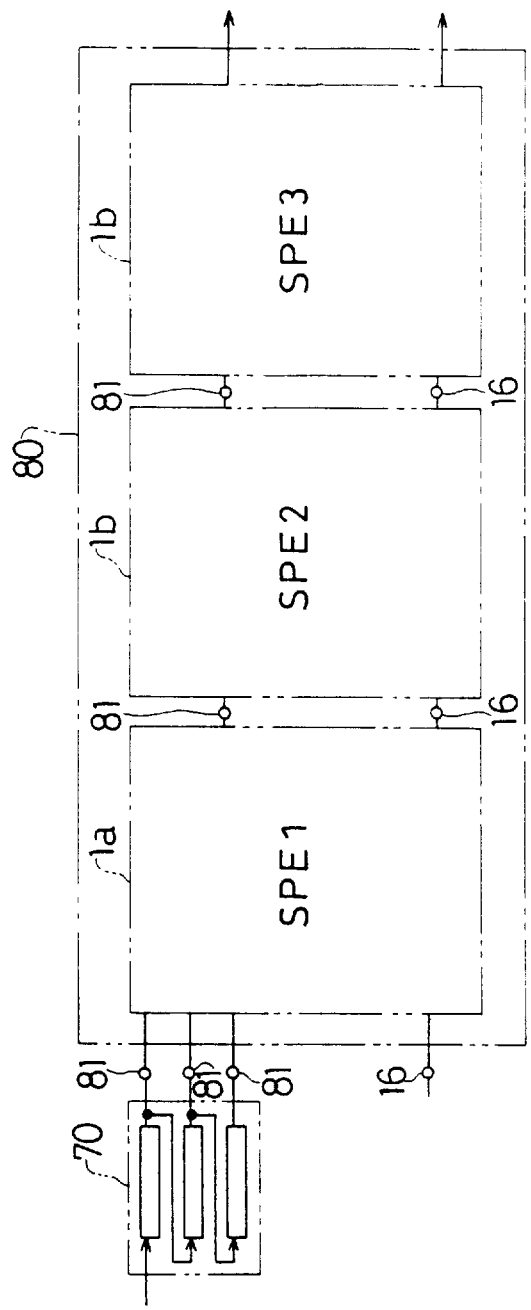
FIG. 1 is a block diagram showing the overall structure of a signal processing apparatus according to a first embodiment of the present invention.

FIG. 1 shows the overall structure of a signal processing apparatus according to a first embodiment of the present invention. The signal processing apparatus, which is for use in sequentially performing a vertical filtering process and a horizontal filtering process with respect to an image data signal of television, comprises a line memory 70 for supplying data signals on three lines and a signal processing unit 80 composed of three signal processing elements (SPEs) 1a, 1b, and 1b connected in cascade. Hereinafter, the signal processing element 1a in a first stage, the signal processing element 1b in a second stage, and the signal processing element 1b in a third stage will be termed SPE1, SPE2, and SPE3, respectively. The SPE1 has three first inputs 81 for receiving three respective line data signals supplied from the line memory 70 and one second input 16. Each of the SPE2 and SPE3 has one first input 81 and one second input 16.

Figure 2:
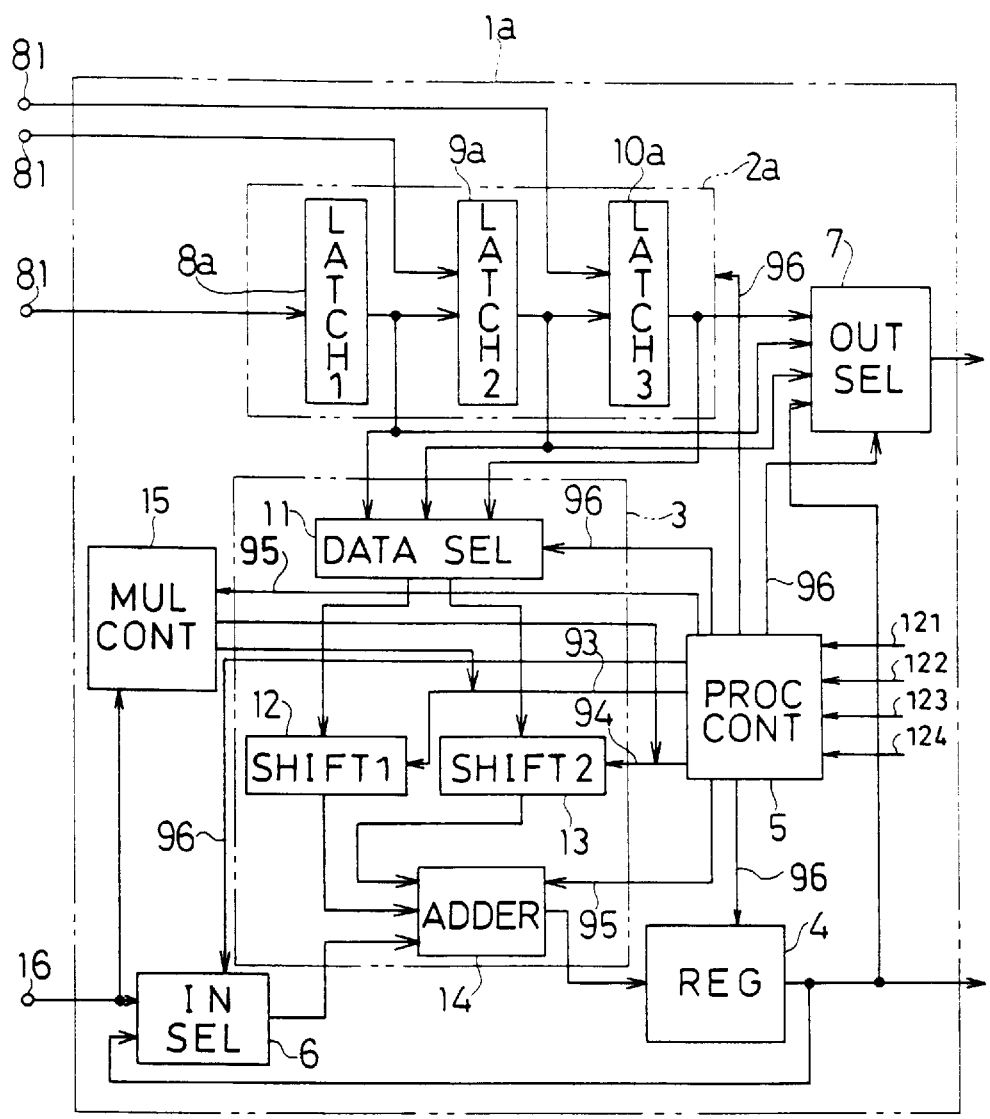
FIG. 2 is a block diagram showing the internal structure of a signal processing element in a first stage in FIG. 1.

FIG. 2 shows the internal structure of the SPE1 in FIG. 1. The SPE1 comprises: a data holding circuit 2a; a product-sum circuit 3; a result register 4; a processing control circuit 5; an input selecting circuit 6; an output selecting circuit 7; and a multiplication control circuit 15.

The data holding circuit 2a is composed of a first latch 8a, a second latch 9a, and a third latch 10a for holding three data signals supplied simultaneously through the respective first inputs 81. The first, second, and third latches 8a, 9a, and 10a are connected in cascade such that the data signal from one of the three first inputs 81 is input to the first latch 8a, while the data signal held in the first latch 8a and the data signal held in the second latch 9a are transferred to the second latch 9a and to the third latch 10a, respectively.

The product-sum circuit 3 is for multiplying the data signals held in the data holding circuit 2a by a given power-of-2 number (e.g., ½, ¼, ⅛, 1/16, . . . ), while adding up respective products obtained in the multiplication and a data signal supplied through the second input 16. The product-sum circuit 3 has: a data selecting circuit 11; a first shifter 12; a second shifter 13; and an adder 14. The data selecting circuit 11 selects one of the three data signals held in the data holding circuit 2a and supplies the selected one data signal to the first and second shifters 12 and 13 or selects two of the three data signals held in the data holding circuit 2a and distributes the selected two data signals to the first and second shifters 12 and 13. Each of the first and second shifters 12 and 13 performs a specified amount of shift processing with respect to the data signal supplied from the data selecting circuit 11. The adder 14 is for performing an arithmetic operation such as addition and subtraction among the three data signals supplied from the first and second shifters 12 and 13 and from the input selecting circuit 6. The result of the operation is stored in the result register 4.

The input selecting circuit 6 is for selecting either one of the data signal supplied through the second input 16 and the operation result stored in the result register 4 and supplying the selected one to the adder 14. The output selecting circuit 7 is for selecting any one among four, i.e., the three data signals held in the data holding circuit 2a and the operation result stored in the result register 4, and supplying the selected one to the first input 81 of the SPE2. The operation result stored in the result register 4 is also supplied to the second input 16 of the SPE2. The multiplication control circuit 15 is for controlling the amount of shifting to be performed by the first and second shifters 12 and 13 based on the data signal supplied through the second input 16. The processing control circuit 5 is for controlling respective operations of the data holding circuit 2a, product-sum circuit 3, result register 4, input selecting circuit 6, output selecting circuit 7, and multiplication control circuit 15.

Figure 3:
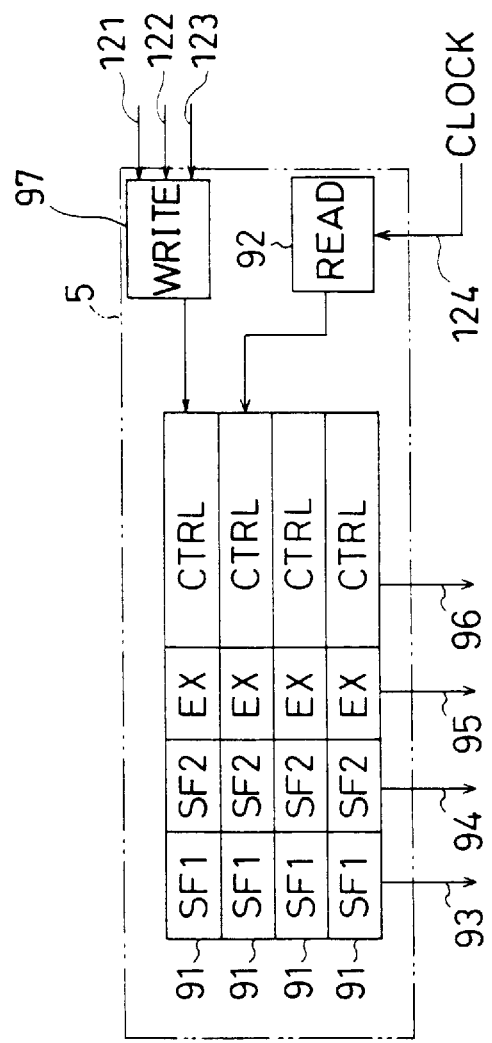
FIG. 3 is a block diagram showing the internal structure of a processing control circuit in FIG. 2.

FIG. 3 shows the internal structure of the processing control circuit 5. The processing control circuit 5 comprises: a plurality of control registers 91 for storing control information such that it can be read therefrom; a writing circuit 97 for writing the control information in the plurality of control registers 91; and a reading circuit 92 for reading the control information from the plurality of control registers 91. To the writing circuit 97 is given: an address for designating one of the control registers 91 in which the control information is to be written via an address bus 121; data representing the control information to be written via a data bus 122; and a write control signal via a signal line 123. Each of the control registers 91 is composed of: a first shift field SF1; a second shift field SF2; an operation field EX; and a control field CTRL. In the first shift field SF1 is stored an amount of shifting to be performed by the first shifter 12, while an amount of shifting to be performed by the second shifter 13 is stored in the second shift field SF2. In the operation field EX is stored information for designating operation rules for the adder 14 and activation information for the multiplication control circuit 15. In the control field CTRL is stored information for controlling the data holding circuit 2a, result register 4, input selecting circuit 6, output selecting circuit 7, and data selecting circuit 11. To the reading circuit 92 is supplied a clock signal via a signal line 124. The reading circuit 92 cyclically reads the control information from a given number of control registers 91 in synchronization with the supplied clock signal. The contents of the respective fields of the control registers 91 which have been read out are provided individually as control signals 93, 94, 95, and 96.

The processing control circuit 5 controls the amounts of shifting to be performed by the shifters 12 and 13 only in the case of multiplying a data signal by a constant. In the case of multiplying a data signal by another data signal, the multiplication control circuit 15 is used. In the latter case, a multiplicand is held in the data holding circuit 2a, while a multiplier factor is given to the multiplication control circuit 15 through the second input 16. The multiplication control circuit 15 examines each of the bits of the multiplier factor and controls the amounts of shifting to be performed by the shifters 12 and 13 with respect to the multiplicand based on the values of the respective bits. The results of additions performed by the adder 14 are accumulated by the same adder 14, thereby multiplying the multiplicand by the multiplier factor.

Figure 4:
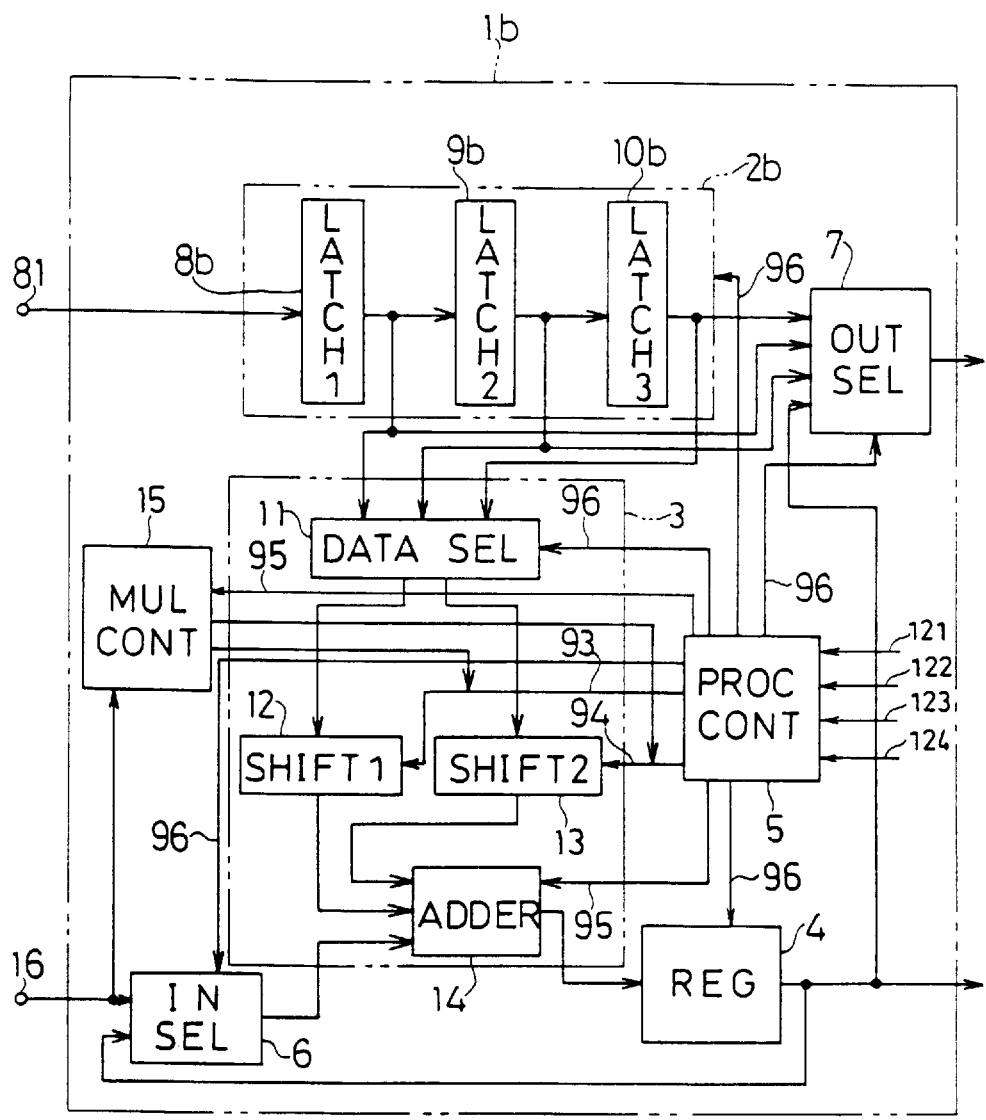
FIG. 4 is a block diagram showing the internal structure of each of the signal processing elements in second and third stages in FIG. 1.

FIG. 4 shows the internal structure of each of the SPE2 and SPE3 in FIG. 1. The data holding circuit 2b of the SPE in FIG. 4 is composed of a first latch 8b, a second latch 9b, and a third latch 10b for holding three data signals sequentially supplied through the first input 81. As for the other components, they are the same as those of the SPE1 in FIG. 2, so that the description thereof will be omitted by providing blocks having the same functions as in the SPE1 with the same reference numerals.

Below, three specific examples of processing implemented by using the signal processing apparatus of FIG. 1 will be described.

<PROCESSING EXAMPLE 1.1>

A description will be given first to an example in which the SPE1 performs a 3-tap vertical filtering process with the coefficients ¼, ½, and ¼ and then the SPE2 performs a 3-tap horizontal filtering process with the coefficients 3/16, ⅝ and 3/16. In this case, the values 2, 1, and 2 are written in the respective first shift fields SF1 of the three control registers 91 of the SPE1. On the other hand, the values 3, 1, and 3 are written in the respective first shift fields SF1 of the three control registers 91 of the SPE2, while the values 4, 3, and 4 are written in the respective second shift fields SF2 of the three control registers 91 thereof.

Figure 5:
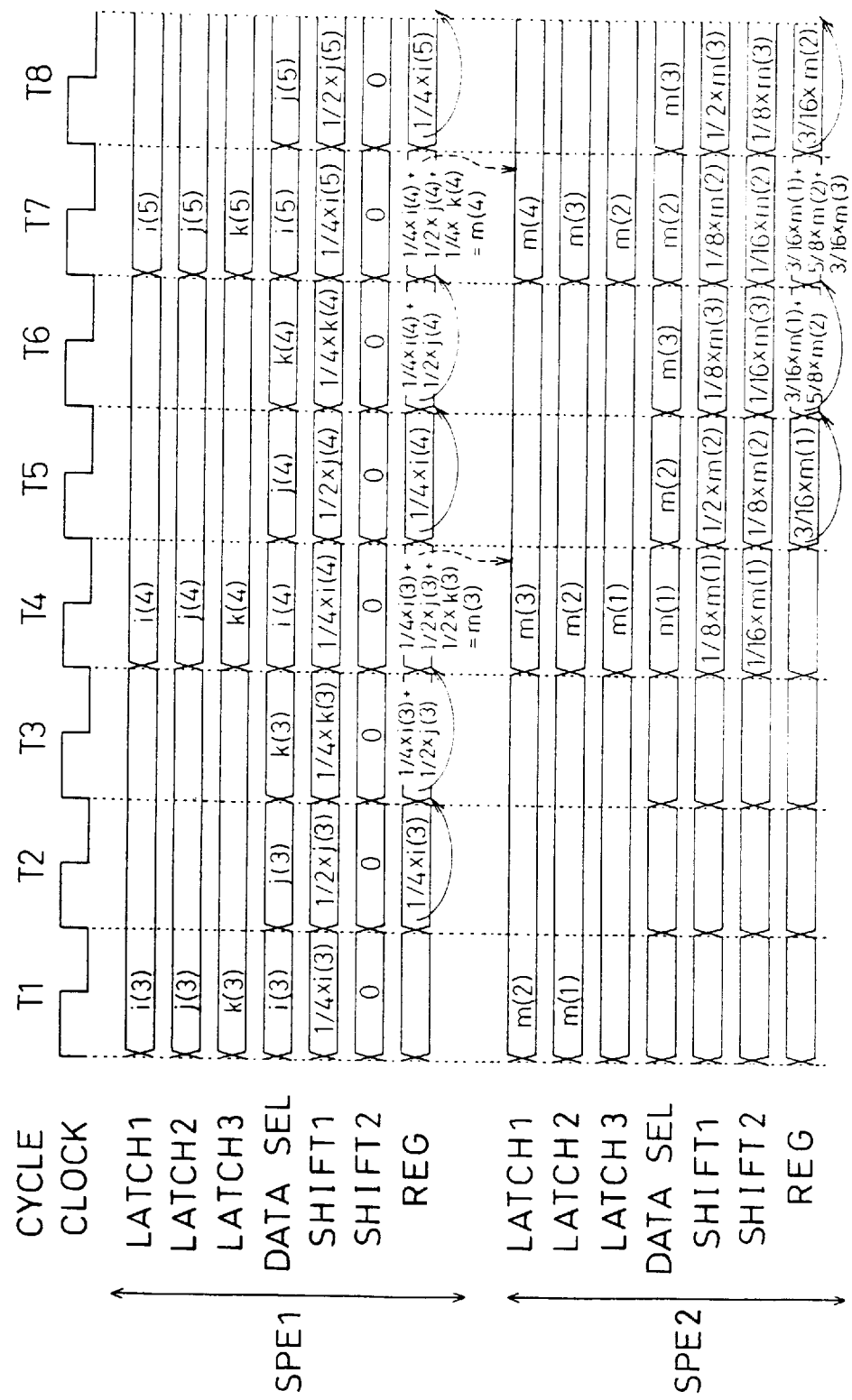
FIG. 5 is a timing chart showing a first example of processing performed by the signal processing apparatus of FIG. 1.

FIG. 5 is a timing chart showing the present processing example. In the SPE1, a data signal i(3), a data signal j(3), and a data signal k(3) are input to and held in the first, second, and third latches 8a, 9a, and 10a, respectively, in the cycle T1. Then, the data selecting circuit 11 selects the data signal i(3) in the first latch 8a and outputs it to each of the first and second shifters 12 and 13. The first shifter 12 shifts the data signal i(3) to the right by 2 bits and outputs the result to the adder 14. In short, the first shifter 12 outputs $\frac{1}{4} \times i(3)$, which is the product of $\frac{1}{4}$ obtained by raising 2 to the minus second power and the data signal i(3), while the second shifter 13 outputs 0. The content of the result register 4 has previously been cleared to zero, so that the input selecting circuit 6 gives 0 obtained from the result register 4 to the adder 14. The adder 14 adds the respective two values $\frac{1}{4} \times i(3)$ and 0 from the shifters 12 and 13 to 0 and outputs the result. The value of the output becomes $\frac{1}{4} \times i(3)$. In the subsequent cycle T2, the output $\frac{1}{4} \times i(3)$ from the adder 14 is stored in the result register 4. Although the second shifter 13 has been adapted to output 0 here, it is also possible to alternatively adapt the adder 14 to ignore the output from the second shifter 13. In the cycle T2, the data selecting circuit 11 selects the data signal j(3) held in the second latch 9a and outputs it to each of the shifters 12 and 13. The first shifter 12 shifts the data signal j(3) to the right by 1 bit and outputs $\frac{1}{2} \times j(3)$. The second shifter 13 outputs 0. At this time, the input selecting circuit 6 selects the operation result $\frac{1}{4} \times i(3)$ stored in the result register 4 and gives it to the adder 14. The adder 14 adds the respective values $\frac{1}{2} \times j(3)$ and 0 from the shifters 12 and 13 to the content $\frac{1}{4} \times i(3)$ of the result register 4 and outputs the result. The value of the output $\frac{1}{4} \times i(3) + \frac{1}{2} \times j(3)$ is stored in the result register 4 in the subsequent cycle T3. In the cycle T3, the data selecting circuit 11 selects the data signal k(3) held in the third latch 10a. The first shifter 12 shifts the data signal k(3) to the right by 2 bits and outputs the resulting value $\frac{1}{4} \times k(3)$ to the adder 14. The second shifter 13 outputs 0. At this time, the input selecting circuit 6 selects the operation result stored in the result register 4 and gives it to the adder 14. The adder 14 adds the respective values $\frac{1}{4} \times k(3)$ and 0 from the shifters 12 and 13 to the content of the result register 4 and outputs $\frac{1}{4} \times i(3) + \frac{1}{2} \times j(3) + \frac{1}{4} \times k(3)$. In the subsequent cycle T4, the operation result is stored in the result register 4. The value obtained is the result of the 3-tap vertical filtering process with the coefficients $\frac{1}{4}$, $\frac{1}{2}$, and $\frac{1}{4}$. The value is assumed to be m(3). In the cycle T4, new data signals i(4), j(4), and k(4) are also input to the latches 8a, 9a, and 10a. The same processes as performed with respect to the data signals i(3), j(3), and k(3) in the cycles T1, T2, and T3 are repeated in the cycles T4, T5, and T6. In the cycle T7, a result m(4) of the vertical filtering process is stored in the result register 4.

In the SPE2, the values m(2), m(3), . . . held in the first latch 8b are transferred to the second latch 9b in the cycles T4, T7, . . . , respectively, while the values m(1), m(2), . . . held in the second latch 9b are transferred to the third latch 10b. To the first latch 8b are sequentially input the data signals m(3), m(4), . . . in the result register 4 which are selected by the output selecting circuit 7 in the SPE1. In the cycle T4, the three data signals m(3), m(2), and m(1) resulting from the vertical filtering process are held in the first, second, and third latches 8b, 9b, and 10b, while the data selecting circuit 11 selects the data signal m(1) held in the third latch 10b and outputs it to each of the shifters 12 and 13. The data signal m(1) is shifted by the first and second shifters 12 and 13 to the right by 3 bits and by 4 bits, respectively, and output to the adder 14. The adder 14 adds up the respective outputs $\frac{1}{8} \times m(1)$ and $\frac{1}{16} \times m(1)$ from the shifters 12 and 13 and stores the resulting value $\frac{3}{16} \times m(1)$ in the result register 4 in the subsequent cycle T5. In the cycle T5, the data signal m(2) held in the second latch 9b is shifted by the shifters 12 and 13 to the right by 1 bit and by 3 bits, respectively, and input to the adder 14. At this time, the input selecting circuit 6 selects the operation result stored in the result register 4 and gives it to the adder 14. The adder 14 adds up the value $\frac{3}{16} \times m(1)$ stored in the result register 4 and the two respective values $\frac{1}{2} \times m(2)$ and $\frac{1}{8} \times m(2)$ from the shifters 12 and 13. The resulting value $\frac{3}{16} \times m(1) + \frac{5}{8} \times m(2)$ is stored in the result register 4 in the subsequent cycle T6. In the cycle T6, the data signal m(3) held in the first latch 8b is shifted by the shifters 12 and 13 to the right by 3 bits and by 4 bits, respectively, and input to the adder 14. At this time, the input selecting circuit 6 selects the operation result stored in the result register 4 and gives it to the adder 14. The adder 14 adds up the value $\frac{3}{16} \times m(1) + \frac{5}{8} \times m(2)$ and the two respective values $\frac{1}{8} \times m(3)$ and $\frac{1}{16} \times m(3)$ from the shifters 12 and 13 and stores the resulting value $\frac{3}{16} \times m(1) + \frac{5}{8} \times m(2) + \frac{3}{16} \times m(3)$ in the result register 4 in the subsequent cycle T7. The value obtained is the result of the 3-tap horizontal filtering process with the coefficients $\frac{3}{16}$, $\frac{5}{8}$, and $\frac{3}{16}$. In the cycle T7 and thereafter, the same horizontal filtering processes will be performed with respect to the results m(2), m(3), . . . of the vertical filtering processes.

In this manner, each of the 3-tap vertical filtering process and 3-tap horizontal filtering process can be implemented by the SPE1 and SPE2. Thereafter, the result obtained in the SPE2 is given to the first latch 8b of the SPE3 via the output selecting circuit 7 of the SPE2 and subjected to another filtering process in the SPE3.

<PROCESSING EXAMPLE 1.2>

Next, a description will be given to an example in which the SPE1 performs the 3-tap vertical filtering process with the coefficients $\frac{1}{4}$, $\frac{1}{2}$, and $\frac{1}{4}$ and then the SPE2 and SPE3 perform a 5-tap horizontal filtering process with the coefficients $\frac{3}{32}$, $\frac{3}{16}$, $\frac{7}{16}$, $\frac{3}{16}$, and $\frac{3}{32}$. In this case, the values 2, 1, and 2 are written in the respective first shift fields SF1 of the three control registers 91 of the SPE1. On the other hand, the values 4, 3, and 1 are written in the respective first shift fields SF1 of the three control registers 91 of the SPE2, while the values 5, 4, and 4 are written in the respective second shift fields SF2 of the three control registers 91 thereof. Furthermore, the values 3 and 4 are written in the respective first shift fields SF1 of the two control registers 91 of the SPE3, while the values 4 and 5 are written in the respective second shift fields SF2 of the two control registers 91 thereof.

Figure 6:
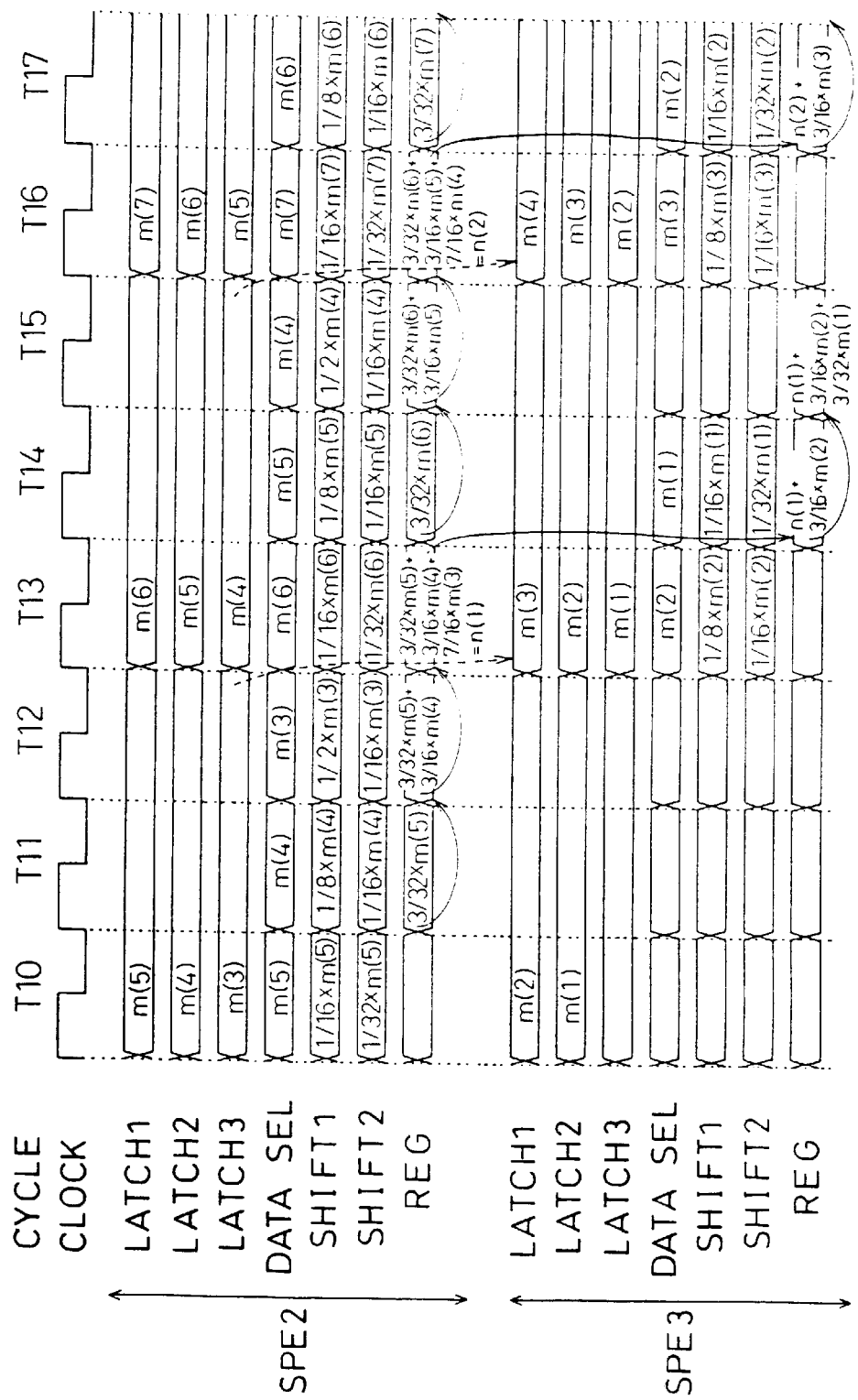
FIG. 6 is a timing chart showing a second example of processing performed by the signal processing apparatus of FIG. 1.

FIG. 6 is a timing chart showing the present processing example. As for the vertical filtering process performed in the SPE1, it is the same as in the case of FIG. 5, so that a description will be given only to the operations of the SPE2 and SPE3 in the cycle T10 and thereafter. In the SPE2, respective data signals m(4) and m(3) held in the first and second latches 8b and 9b are transferred to the second and third latches 9b and 10b, respectively, in the cycle T10. To the first latch 8b is input a value stored in the result register 4 selected by the output selecting circuit 7 in the SPE1, i.e., a result m(5) of the vertical filtering process, through the first input 81. The data selecting circuit 11 in the SPE2 selects the data signal m(5) held in the first latch 8b and outputs it to each of the shifters 12 and 13. The data signal m(5) is shifted by the first and second shifters 12 and 13 to the right by 4 bits and by 5 bits, respectively, and output to the adder 14. The adder 14 adds up the respective outputs $\frac{1}{16} \times m(5)$ and $\frac{1}{32} \times m(5)$ from the shifters 12 and 13 and stores the resulting value $\frac{3}{32} \times m(5)$ in the result register 4 in the subsequent cycle T11. In the cycle T11, the shifters 12 and 13 shift the data signal m(4) held in the second latch 9b to the right by 3 bits and by 4 bits, respectively, and outputs the results to the adder 14. At this time, the input selecting circuit 6 selects the operation result stored in the result register 4 and gives it to the adder 14. The adder 14 adds up the value $\frac{3}{32} \times m(5)$ stored in the result register 4 and the respective outputs $\frac{1}{8} \times m(4)$ and $\frac{1}{16} \times m(4)$ from the shifters 12 and 13 and stores the resulting value $\frac{3}{32} \times m(5) + \frac{3}{16} \times m(4)$ in the result register 4 in the subsequent cycle T12. In the cycle T12, the data signal m(3) held in the third latch 10b is shifted by the shifters 12 and 13 to the right by 1 bit and by 4 bits, respectively, and given to the adder 14. At this time, the input selecting circuit 6 selects the operation result stored in the result register 4 and gives it to the adder 14. The adder 14 initially subtracts the value $\frac{1}{16} \times m(3)$ in the second shifter 13 from the value $\frac{1}{2} \times m(3)$ in the first shifter 12, then adds the subtraction result to the value $\frac{3}{32} \times m(5) + \frac{3}{16} \times m(4)$ stored in the result register 4, and finally outputs the resulting sum. The resulting value $\frac{3}{32} \times m(5) + \frac{3}{16} \times m(4) + \frac{7}{16} \times m(3)$ is stored in the result register 4 in the subsequent cycle T13. In this manner, a 3-tap partial sum $\frac{3}{32} \times m(5) + \frac{3}{16} \times m(4) + \frac{7}{16} \times m(3)$ of the result of the 5-tap horizontal filtering process is obtained in the SPE2. The value obtained is assumed to be n(1). In the cycle T13, the data signals m(5) and m(4) held in the first and second latches 8b and 9b are transferred to the second and third latches 9b and 10b, respectively. To the first latch 8b is input a value m(6) in the result register 4 which is selected by the output selecting circuit 7 in the SPE1. Thereafter, a 3-tap partial sum n(2), which is $\frac{3}{32} \times m(6) + \frac{3}{16} \times m(5) + \frac{7}{16} \times m(4)$, is obtained likewise in the cycle T16.

In the SPE3, data signals m(2) and m(1) held in the first and second latches 8b and 9b are transferred to the second and third latches 9b and 10b, respectively, in the cycle T13. To the first latch 8b is input the data signal m(3) in the third latch 10b which is selected by the output selecting circuit 7 in the SPE2. The data selecting circuit 11 in the SPE3 selects the data signal m(2) held in the second latch 9b and inputs it to each of the shifters 12 and 13. The data signal m(2) is shifted by the shifters 12 and 13 to the right by 3 bits and by 4 bits, respectively, and the resulting two values $\frac{1}{8} \times m(2)$ and $\frac{1}{16} \times m(2)$ are given to the adder 14. At this time, the input selecting circuit 6 selects the data signal from the second input 16 and inputs the value n(1) stored in the result register 4 of the SPE2 to the adder 14 through the second input 16. The adder 14 adds up the three values and stores the resulting value $n(1) + \frac{3}{16} \times m(2)$ in the result register 4 in the subsequent cycle T14. In the cycle T14, the data selecting circuit 11 selects the data signal m(1) held in the third latch 10b, which is shifted by the shifters 12 and 13 to the right by 4 bits and by 5 bits, respectively, and given to the adder 14. At this time, the input selecting circuit 6 selects the operation result stored in the result register 4 of the SPE3 and gives it to the adder 14. The adder 14 adds up the value stored in the result register 4 and the two respective values $\frac{1}{16} \times m(1)$ and $\frac{1}{32} \times m(1)$ from the shifters 12 and 13. The addition result $n(1) + \frac{3}{16} \times m(2) + \frac{3}{32} \times m(1)$, which is the result of the 5-tap horizontal filtering process, is thus stored in the result register 4 in the subsequent cycle T15. Likewise, the results of the 5-tap horizontal filtering processes are obtained in the cycle T16 and thereafter.

Thus, the 3-tap vertical filtering process is implemented by the SPE1, while the 5-tap horizontal filtering process is implemented by the SPE2 and SPE3. In the case where the coefficient is $\frac{43}{64}$, for example, the coefficient is broken down into $\frac{1}{64}$, $\frac{2}{64}$, $\frac{8}{64}$, and $\frac{32}{64}$ and two multiplications are performed in each cycle.

<PROCESSING EXAMPLE 1.3>

A description will further be given to an example in which the SPE1 performs a 3-tap vertical filtering process with the coefficients $\frac{1}{8}$, $\frac{3}{4}$, and $\frac{1}{8}$. In this case, the values 3 and 1 are written in the respective first shift fields SF1 of the two control registers 91 in the SPE1, while the values 3 and 2 are written in the respective second shift fields SF2 of the two control registers 91 therein.

In the cycle T1, data signals d3, d2, and d1 are held in the first, second, and third latches 8a, 9a, and 10a, respectively. The data selecting circuit 11 selects the data signal d3 in the first latch 8a and the data signal d1 in the third latch 10a and outputs the data signal d3 to the first shifter 12 and the data signal d1 to the second shifter 13. The shifters 12 and 13 shift the data signals d3 and d1 to the right by 3 bits, respectively, and output the results to the adder 14. The adder 14 adds up the respective outputs $\frac{1}{8} \times d3$ and $\frac{1}{8} \times d1$ from the shifters 12 and 13 and stores the resulting values $\frac{1}{8} \times d3 + \frac{1}{8} \times d1$ in the result register 4 in the subsequent cycle T2. In the cycle T2, the data selecting circuit 11 selects the data signal d2 held in the second latch 9a and outputs the data signal d2 to each of the first and second shifters 12 and 13. The first shifter 12 shifts the data signal d2 to the right by 1 bit and gives the result to the adder 14. On the other hand, the second shifter 13 shifts the data signal d2 to the right by 2 bits and gives the result to the adder 14. At this time, the input selecting circuit 6 selects the value stored in the result register 4 and gives it to the adder 14. The adder 14 adds up the respective outputs $\frac{1}{2} \times d2$ and $\frac{1}{4} \times d2$ from the shifters 12 and 13 and the value stored in the result register 4 and stores the resulting value $\frac{1}{8} \times d3 + \frac{3}{4} \times d2 + \frac{1}{8} \times d1$ in the result register 4 in the subsequent cycle T3. Thus, by performing the shift/add processing for the two different data signals d3 and d1 at a time in one cycle, the time required by the processing can be reduced.

In the case of performing a differential process between two lines in the SPE1, the data selecting circuit 11 selects the data signal d2 in the second latch 9a and the data signal d1 in the third latch 10a so that the shifters 12 and 13 input the outputs from the data selecting circuit 11 as they are to the adder 14. As a result, the adder 14 performs a subtraction between the two data signals d2 and d1, thereby executing the differential process between two lines in one cycle.

FIGS. 7A and 7B show respective extended examples of the signal processing apparatus of FIG. 1. In FIG. 7A, a 3-tap vertical filtering process, a 3-tap horizontal filtering process, and another 7-tap filtering process are implemented using one signal processing element 1a and four signal processing elements 1b. A central processing unit (CPU) 120 in FIG. 7A is for individually setting control information for respective control registers 91 of the signal processing elements 1a and 1b. It is also possible, as shown in FIG. 7B, to execute a 3-tap vertical filtering process and two 5-tap filtering processes with the same structure.

Figure 8:
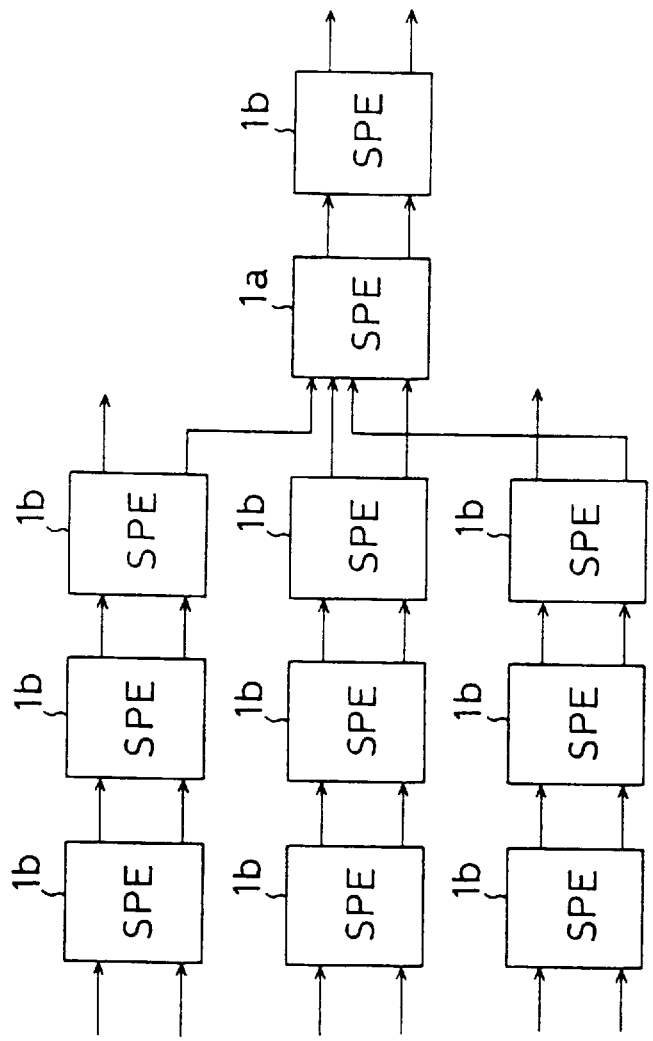
FIG. 8 is a block diagram showing another example of the connection of the signal processing elements in FIG. 1.

FIG. 8 shows another example of the connection of the signal processing elements 1a and 1b. In FIG. 8, the outputs from the three signal processing elements 1b are given to each of the three first inputs 81 of the signal processing element 1a. After performing respective horizontal filtering processes with respect to three line data signals, the result of each of the respective horizontal filtering processes is subjected to a vertical filtering process.

Figure 9:
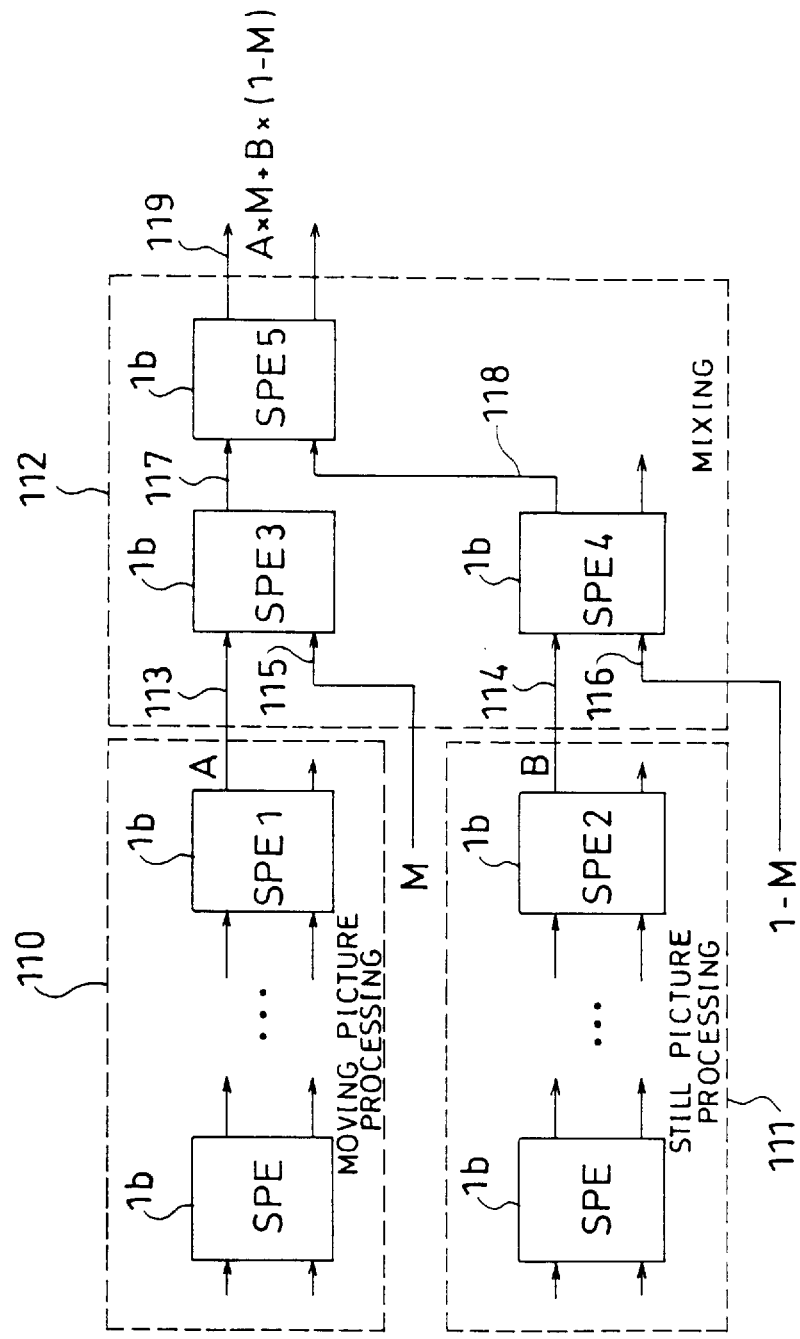
FIG. 9 is a block diagram showing still another example of the connection of the signal processing elements in FIG. 1.

FIG. 9 shows another example of the connection of the signal processing elements 1b in FIG. 1, in which is performed a process of mixing, in accordance with a motion amount M (0≦M≦1), an image data signal A that has been subjected to moving picture processing with an image data signal B that has been subjected to still picture processing as typically observed in image processing of high definition television (HDTV). In the figure are shown: a moving-picture processing unit 110; a still-picture processing unit 111; and a mixing unit 112. The signal processing element 1b in the final stage of the moving-picture processing unit 110 is termed SPE1. The signal processing element 1b in the final stage of the still-picture processing element 111 is termed SPE2. The three signal processing elements 1b constituting the mixing unit 112 are termed SPE3, SPE4, and SPE5. The SPE1 gives the data signal A resulting from the moving picture processing to a first input 113 of the SPE3. The SPE 2 gives the data signal B resulting from the still picture processing to a first input 114 of the SPE4. The mixing is a process of obtaining the mixing result A×M+B× (1−M) from the data signals A and B and from the motion amount M. In the SPE3, a number representing the motion amount M is supplied through a second input 115 to the multiplication control circuit 15, thereby executing the multiplication A×M. In the SPE4, a number representing 1−M is supplied through a second input 116 to the multiplication control circuit 15, thereby executing the multiplication B× (1−M). The respective multiplication results obtained in the SPE3 and SPE4 are given to first and second inputs 117 and 118 of the SPE5 so that an addition is performed in the SPE5. In this manner, the mixing result A×M+B× (1−M) is obtained at an output 119 of the SPE5.

SECOND EMBODIMENT

Figure 10:
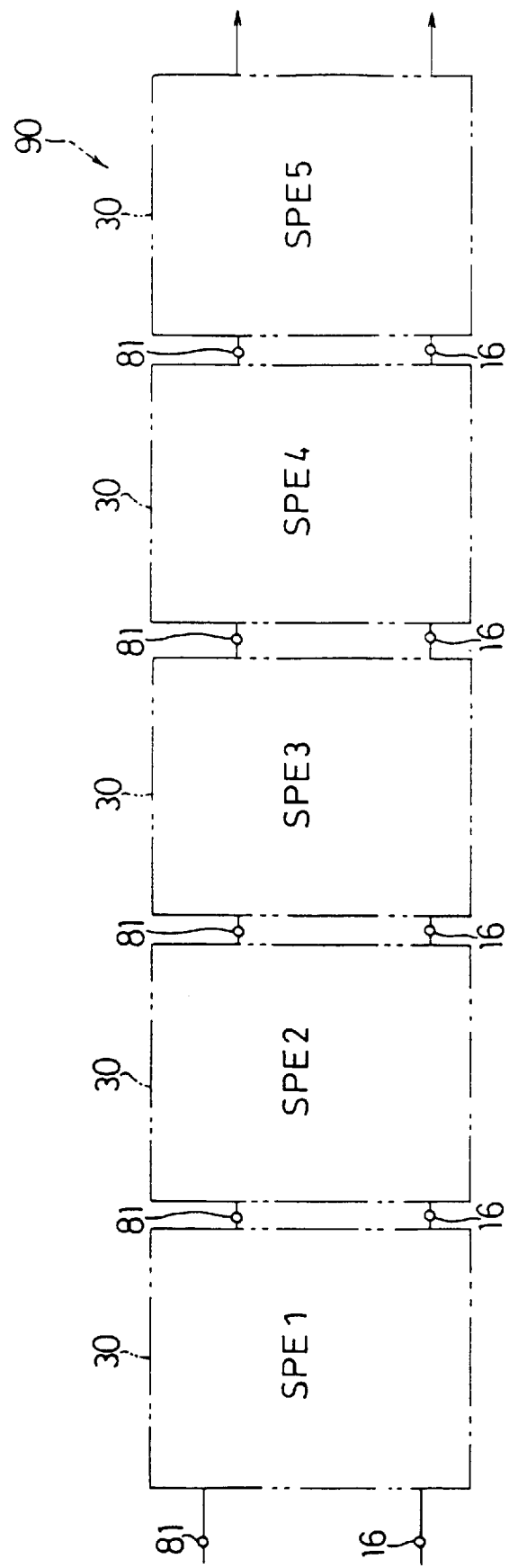
FIG. 10 is a block diagram showing the overall structure of a signal processing apparatus according to a second embodiment of the present invention.

FIG. 10 shows the overall structure of a signal processing apparatus according to a second embodiment of the present invention. The signal processing apparatus comprises a signal processing unit 90 composed of five signal processing elements (SPEs) 30 connected in cascade. The signal processing elements 30 in the first, second, third, fourth, and fifth stages will be termed SPE1, SPE2, SPE3, SPE4, and SPE5, respectively. Each of the SPE1, SPE2, SPE3, SPE4, and SPE5 has a single first input 81 and a single second input 16. To the second input 16 of the SPE1 is given zero.

Figure 11:
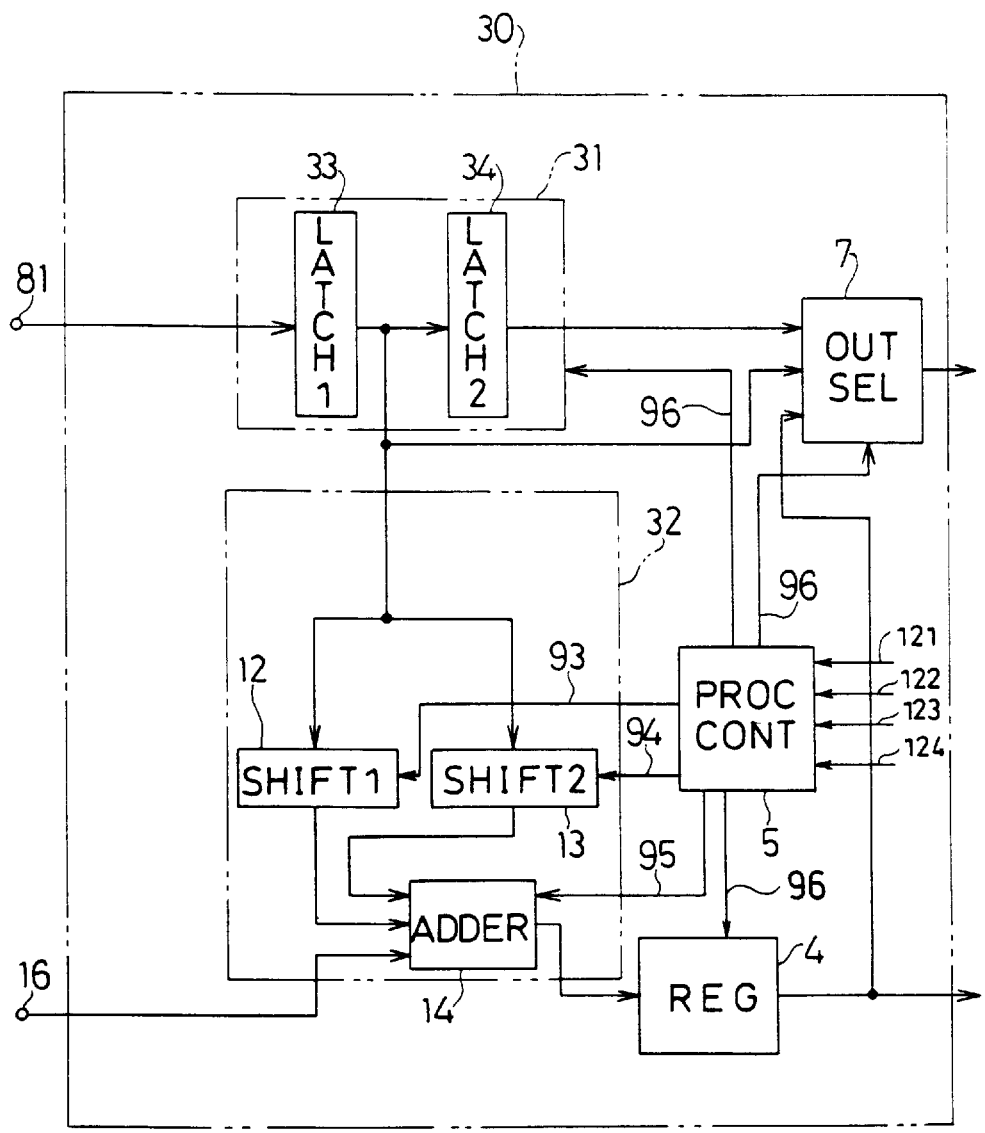
FIG. 11 is a block diagram showing the internal structure of each of the signal processing elements in FIG. 10.

FIG. 11 shows the internal structure of each of the SPEs of FIG. 10. A data holding circuit 31 in the SPE of FIG. 11 is composed of first and second latches 33 and 34 for holding two data signals supplied sequentially through the first input 81. A product-sum circuit 32 in the SPE of FIG. 11 does not comprise the data selecting circuit 11 of FIG. 4, so that the data signal held in the first latch 33 is supplied unconditionally to the first and second shifters 12 and 13. The SPE of FIG. 11 does not comprise the input selecting circuit 6 and multiplication control circuit 15 of FIG. 4, either. As for the other components, they are the same as those of the SPE of FIG. 4, so that the description thereof will be omitted by providing blocks having the same functions as in the SPE of FIG. 4 with the same reference numerals. The number of the control register 91 in the processing control circuit 5 in the SPE of FIG. 11 is 1 (see FIG. 3).

The signal processing apparatus of FIG. 10 is different from the signal processing apparatus of FIG. 1 in that the former executes a 1-tap filtering process by means of a single or a plurality of SPEs. Below, two specific examples of processing implemented by using the signal processing apparatus of FIG. 10 will be described.

<PROCESSING EXAMPLE 2.1>

A description will be given first to an example in which the SPE1, SPE2, and SPE3 perform a 3-tap horizontal filtering process with the coefficients 3/16, 5/8, and 3/16.

Figure 12:
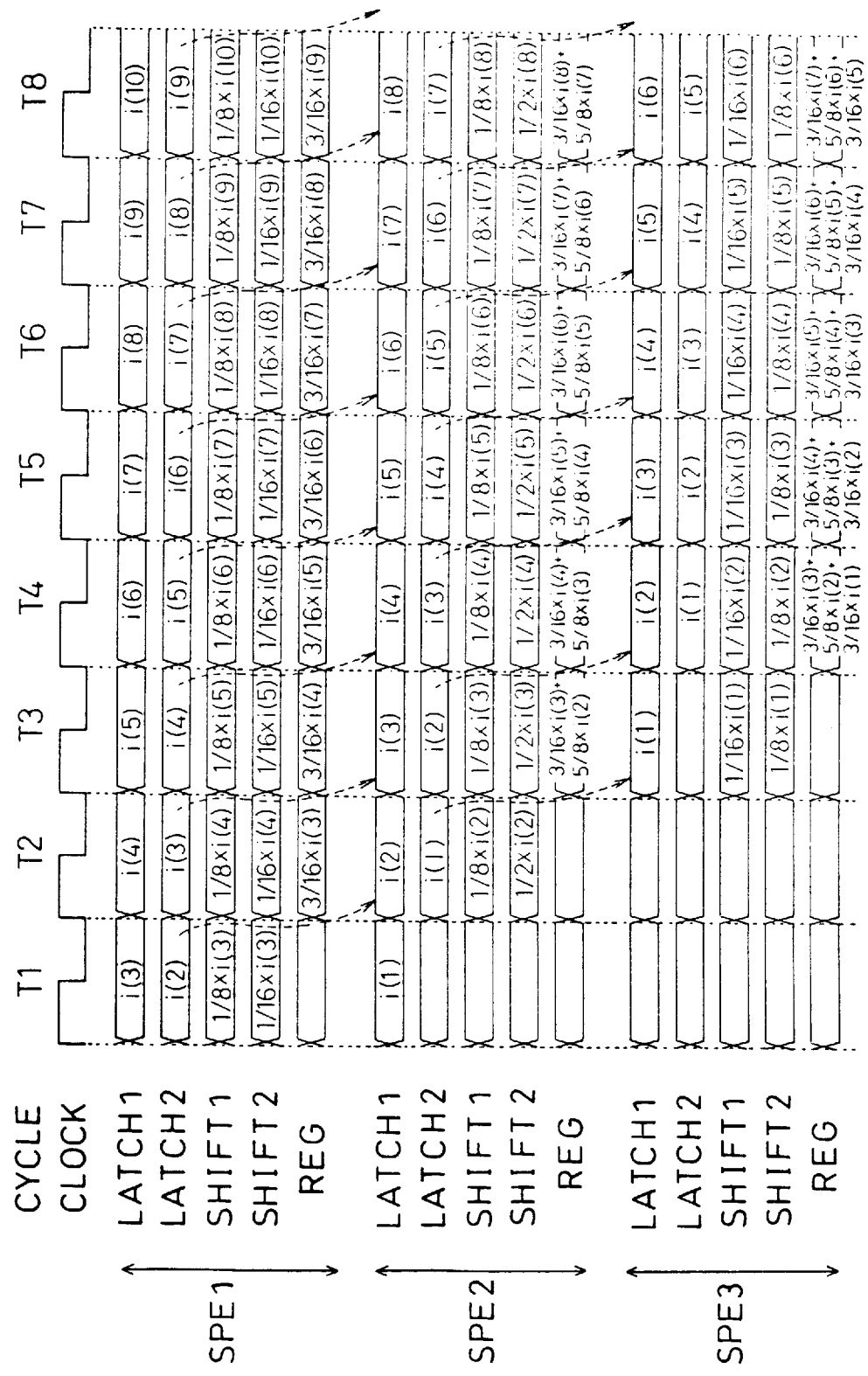
FIG. 12 is a timing chart showing a first example of processing performed by the signal processing apparatus of FIG. 10.

FIG. 12 is a timing chart showing the present processing example. In the SPE1, a data signal i(3) and a data signal i(2) are held in the first and second latches 33 and 34 of the data holding circuit 31, respectively, in the cycle T1. The data signal i(3) in the first latch 33 is shifted by the first and second shifters 12 and 13 to the right by 3 bits and by 4 bits, respectively, and output to the adder 14. The adder 14 adds the respective outputs 1/8×i(3) and 1/16×i(3) from the shifters 12 and 13 to 0 and stores the resulting value 3/16×i(3) in the result register 4 in the subsequent cycle T2. In the cycle T2, the data signal i(3) held in the first latch 33 is transferred to the second latch 34, while a data signal i(4) is newly input to the first latch 33 through the first input 81. The data signal i(4) is similarly shifted by the shifters 12 and 13 to the right by 3 bits and by 4 bits, respectively, so that the two values 1/8×i(4) and 1/16×i(4) are output to the adder 14. The value 3/16×i(4) resulting from the addition performed by the adder 14 is stored in the result register 4 in the subsequent cycle T3. Thereafter, similar processes will be performed sequentially with respect to data signals i(5), i(6), . . . in the first latch 33 in the cycles T3, T4, . . ., respectively. In the SPE1, the output selecting circuit 7 selects, in each cycle, the data signal held in the second latch 34 and outputs it to the SPE2.

In the SPE2, a data signal i(1) held in the first latch 33 is transferred to the second latch 34 in the cycle T2. On the other hand, the data signal i(2) in the second latch 34 which is selected by the output selecting circuit 7 in the SPE1 is input to the first latch 33 through the first input 81. In the SPE2, the data signal i(2) held in the first latch 33 is shifted by the two shifters 12 and 13 to the right by 3 bits and by 1 bit, respectively, and input to the adder 14. At this time, the value 3/16×i(3) in the result register 4 of the SPE1 is input to the adder 14 through the second input 16. The adder 14 adds the two values 1/8×i(2) and 1/2×i(2) from the shifters 12 and 13 to the value 3/16×i(3) given through the second input 16. The resulting value 3/16×i(3)+5/8×i(2) is stored in the result register 4 in the subsequent cycle T3. In the cycle T3, the data signal i(2) held in the first latch 33 of the SPE2 is transferred to the second latch 34. At this time, the output selecting circuit 7 of the SPE1 selects the data signal i(3) held in the second latch 34 and outputs it, while the data signal i(3) is input to the first latch 33 of the SPE2. The data signal i(3) is also subjected to the same processes as performed in the cycle T2. In the SPE2, the output selecting circuit 7 selects, in each cycle, the data signal held in the second latch 34 and outputs it to the SPE3.

In the SPE3, the data signal held in the first latch 33 is transferred to the second latch 34 in the cycle T3. On the other hand, the data signal i(1) in the second latch 34 which is selected by the output selecting circuit 7 in the SPE2 is input to the first latch 33 of the SPE3 through the first input 81. In the SPE3, the data signal i(1) held in the first latch 33 is shifted by the two shifters 12 and 13 to the right by 3 bits and by 4 bits, respectively, and input to the adder 14. At this time, the partial sum 3/16×i(3)+5/8×i(2) held in the result register 4 of the SPE2 is input to the adder 14 through the second input 16. The adder 14 of the SPE3 adds up the partial sum 3/16×i(3)+5/8×i(2) given through the second input 16 and the two values 1/16×i(1) and 1/8×i(1) from the shifters 12 and 13 and stores the resulting values 3/16×i(3)+5/8×i(2)+ 3/16×i(1) in the result register 4 in the subsequent cycle T4, which is the result of the 3-tap horizontal filtering process. In the cycle T4 and thereafter, the results of filtering processes will be obtained in the respective cycles. The operation result stored in the result register 4 of the SPE3 is given to the data holding circuit 31 of the SPE4 via the output selecting circuit 7 of the SPE3, followed by other filtering processes performed by the SPE4 and SPE5.

<PROCESSING EXAMPLE 2.2>

Next, a description will be given to an example in which a 3-tap horizontal filtering process with the coefficients $11/64$, $5/8$, and $11/64$ is performed in the SPE1, SPE2, SPE3, SPE4, and SPE5. The coefficient $11/64$ is given in the form of a sum of three power-of-2 numbers $1/8+1/32+1/64$, while the coefficient $5/8$ is given in the form of a sum of two power-of-2 numbers $1/2+1/8$. Consequently, a 1-tap process with the coefficient $11/64$ is executed in the SPE1 and SPE2. Another 1-tap process with the coefficient $5/8$ is performed in the SPE3. Still another 1-tap process with the coefficient $11/64$ is performed in the SPE4 and SPE5.

Figure 13:
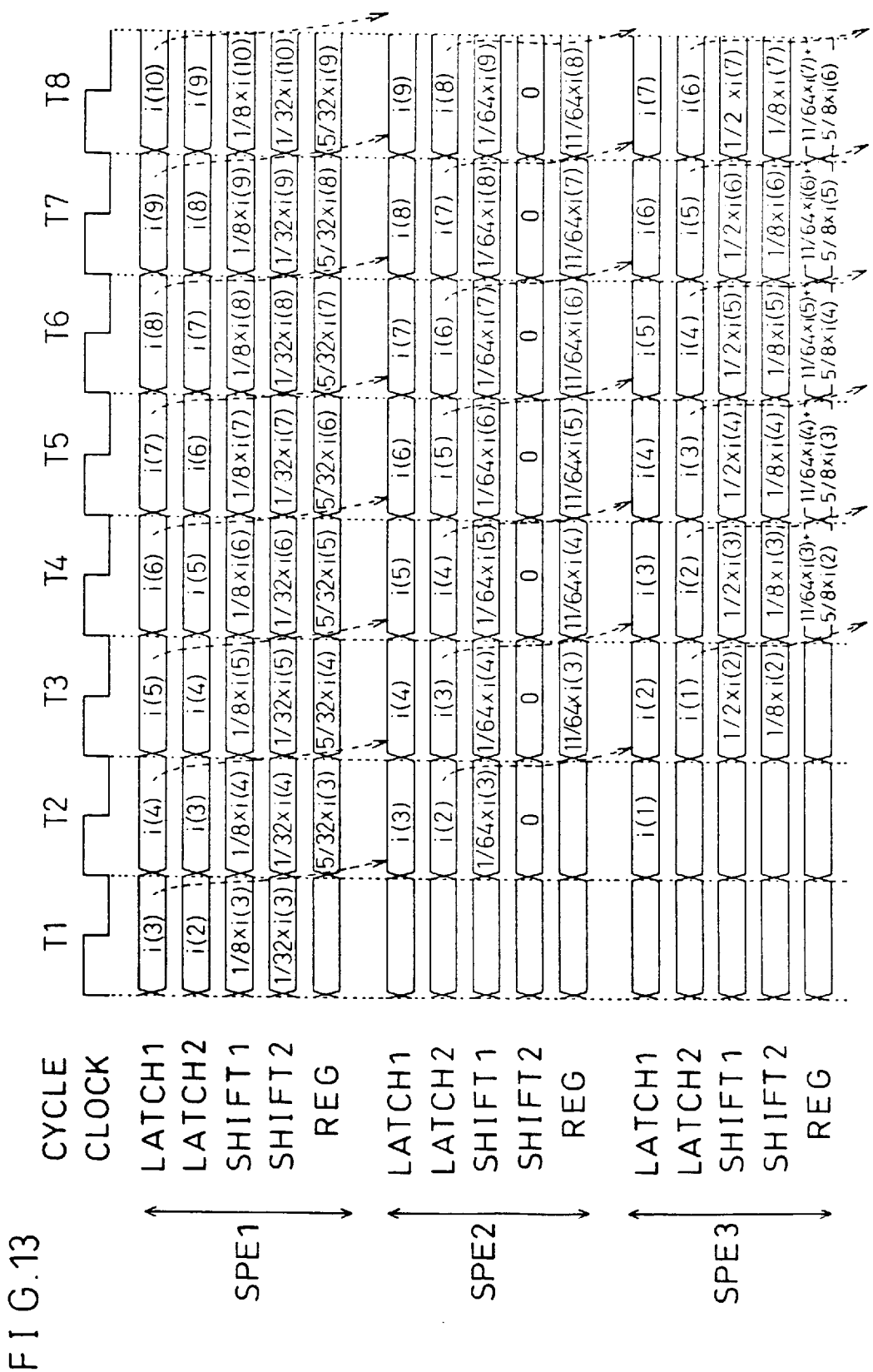
FIG. 13 is a timing chart showing a second example of processing performed by the signal processing apparatus of FIG. 10.

FIG. 13 is a timing chart showing the present processing example. In the SPE1, a data signal i(3) and a data signal i(2) are held in the first and second latches 33 and 34, respectively, in the cycle T1. The data signal i(3) held in the first latch 33 is shifted by the first and second shifters 12 and 13 to the right by 3 bits and by 5 bits, respectively, and output to the adder 14. The adder 14 adds up the respective outputs $1/8 \times i(3)$ and $1/32 \times i(3)$ from the shifters 12 and 13 and stores the resulting value $5/32 \times i(3)$ in the result register 4 in the subsequent cycle T2. In the cycle T2, the SPE1 transfers the data signal i(3) held in the first latch 33 to the second latch 34, while outputting it to the first latch 33 of the SPE2 via the output selecting circuit 7. On the other hand, a data signal i(4) is newly input to the first latch 33 of the SPE1. In the SPE2, the data signal i(3) held in the first latch 33 is output to each of the shifters 12 and 13 and shifted by the first shifter 12 to the right by 6 bits. The second shifter 13 outputs zero. At this time, the value $5/32 \times i(3)$ in the result register 4 of the SPE1 is input through the second input 16 to the adder 14 of the SPE2. The adder 14 of the SPE2 adds up the value $5/32 \times i(3)$ stored in the result register 4 of the SPE1 and the two values $1/64 \times i(3)$ and 0 from the respective shifters 12 and 13 and stores the operation result $11/64 \times i(3)$ in the result register 4 in the subsequent cycle T3. In the cycle T3, the data signal i(2) in the second latch 34 which is selected by the output selecting circuit 7 in the SPE2 is input to the first latch 33 of the SPE3. In the SPE3, the data signal i(2) held in the first latch 33 is shifted by the shifters 12 and 13 to the right by 1 bit and by 3 bits, respectively. At this time, the value $11/64 \times i(3)$ in the result register 4 of the SPE2 is input to the adder 14 of the SPE3 through the second input 16. The adder 14 in the SPE3 adds the two values $1/2 \times i(2)$ and $1/8 \times i(2)$ from the shifters 12 and 13 to the value $11/64 \times i(3)$ stored in the result register 4 of the SPE2. The resulting value $11/64 \times i(3) + 5/8 \times i(2)$ is stored in the result register 4 in the subsequent cycle T4. In the cycle T4, a data signal i(1) in the second latch 34 which is selected by the output selecting circuit 7 in the SPE3 is input to the first latch 33 of the SPE4, which is not shown in the figure. In the SPE4 and SPE5, the same processes as performed above in the SPE1 and SPE2 are performed with respect to the data signal i(1) held in the first latch 33, thereby storing the result of the desired 3-tap horizontal filtering process in the result register 4 of the SPE5. The processing result stored in the result register 4 of the SPE5 is output through the output selecting circuit 7 of the SPE5.

As described above, according to the above first and second embodiments, the flexibility of the processing performed by the signal processing apparatus is improved. Besides the filtering process, the present invention is also applicable to various processes in which multiplication and addition are performed, such as a matrix operation.

We claim:

1. A signal processing apparatus comprising a plurality of processing elements, wherein said plurality of processing elements are connected in cascade so as to constitute a first path for transferring an input data signal of said signal processing apparatus and a second path for transferring a processing result of said input data signal, each of said plurality of processing elements comprising:

a first input disposed on said first path;

a data holding circuit for holding a data signal supplied through said first input;

an operation circuit for calculating a result of an operation performed between the data signal held in said data holding circuit and another data signal;

a second input disposed on said second path so as to supply the other data signal to said operation circuit;

a result register for holding the result of the operation calculated by said operation circuit and supplying said held result of the operation to said second path;

an output selecting circuit for supplying either one of the data signal held in said data holding circuit and the result of the operation held in said result register to said first path; and a processing control circuit for controlling respective operations of said data holding circuit, said operation circuit, said result register, and said output selecting circuit.

2. A signal processing apparatus according to claim 1, wherein said processing control circuit of each of said plurality of processing elements comprises at least one control register for holding control information for designating the respective operations of said data holding circuit, said operation circuit, said result register, and said output selecting circuit.

3. A signal processing apparatus according to claim 2, further comprising means for individually setting the control information for said control register of each of said plurality of processing elements, wherein each of said plurality of processing elements has its function changed in accordance with said control information individually set.

4. A signal processing apparatus according to claim 1, wherein at least one specified processing element of said plurality of processing elements comprises:

one terminal as said first input; and a plurality of latches, as said data holding circuit, for holding a plurality of data signals sequentially supplied through said one terminal, so as to constitute a shift register.

5. A signal processing apparatus according to claim 4, wherein said output selecting circuit of said specified processing element has a function of supplying the data signal held in any one of said plurality of latches to said first path.

6. A signal processing apparatus according to claim 1, wherein the processing element in a forefront stage of said plurality of processing elements comprises:

a plurality of terminals as said first input; and a plurality of latches, as said data holding circuit, for holding a plurality of data signals simultaneously supplied through said plurality of terminals.

7. A signal processing apparatus according to claim 6, further comprising a line memory for simultaneously supplying the plurality of data signals to said plurality of terminals of said processing element in the forefront stage.

8. A signal processing apparatus according to claim 6, wherein said output selecting circuit of said processing element in the forefront stage has a function of supplying the data signal held in any one of said plurality of latches to said first path.

9. A signal processing apparatus according to claim 1, wherein at least one specified processing element of said plurality of processing elements further comprises an input selecting circuit for supplying, as the other data signal, either one of the data signal supplied through said second input and the result of the operation held in said result register to said operation circuit.

10. A signal processing apparatus according to claim 1, wherein said operation circuit in at least one specified processing element of said plurality of processing elements comprises:

a multiplication circuit for calculating a product of the data signal held in said data holding circuit in said specified processing element and a constant; and an adder for calculating a sum of said calculated product and the other data signal.

11. A signal processing apparatus according to claim 10, wherein said multiplication circuit comprises a shifter for performing a specified amount of shift processing with respect to said held data signal.

12. A signal processing apparatus according to claim 11, wherein said processing control circuit in said specified processing element comprises means for controlling the amount of shifting to be performed by said shifter.

13. A signal processing apparatus according to claim 11, wherein said specified processing element further comprises a multiplication control circuit for controlling the amount of shifting to be performed by said shifter based on the data signal supplied through said second input.

14. A signal processing apparatus according to claim 1, wherein said data holding circuit in at least one specified processing element of said plurality of processing elements comprises a plurality of latches for holding a plurality of data signals supplied through said first input and said operation circuit in said specified processing element comprises:

a data selecting circuit for selecting one of the plurality of data signals held in said plurality of latches;

a plurality of shifters each for performing a specified amount of shift processing with respect to said one selected data signal; and an adder for calculating a sum of respective results of the shift processing performed by said plurality of shifters.

15. A signal processing apparatus according to claim 1, wherein said data holding circuit in at least one processing element of said plurality of processing elements comprises a plurality of latches for holding a plurality of data signals supplied through said first input and said operation circuit in said specified processing element comprises:

a data selecting circuit for selecting some of the plurality of data signals held in said plurality of latches;

a plurality of shifters each for performing a specified amount of shift processing with respect to said some selected data signals; and an adder for calculating a sum of respective results of the shift processing performed by said plurality of shifters.

16. a signal processing element for constituting a signal processing apparatus comprising a first path for transferring an input data signal and a second path for transferring a processing result of said input data signal, said signal processing element comprising:

a first input disposed on said first path;

a data holding circuit for holding a data signal supplied through said first input;

an operation circuit for calculating a result of an operation between the data signal held in said data holding circuit and another data signal;

a second input disposed on said second path so as to supply the other data signal to said operation circuit;

a result register for holding the result of the operation calculated by said operation circuit and supplying said held result of the operation to said second path, which is separated from said first path;

an output selecting circuit for supplying either one of the data signal held in said data holding circuit and the result of the operation held in said result register to said first path; and a processing control circuit for controlling respective operations of said data holding circuit, said operation circuit, said result register, and said output selecting circuit.

17. A signal processing element according to claim 16, further comprising, an input selecting circuit for supplying, as the other data signal, either one of the data signal supplied through said second input and the result of the operation held in said result register to said operation circuit.

18. A signal processing element according to claim 16, wherein said operation circuit comprises:

a multiplication circuit for calculating a product of the data signal held in said data holding circuit and a constant; and an adder for calculating a sum of said calculated product and the other data signal.

19. A signal processing element according to claim 18, wherein said multiplication circuit comprises, a shifter for performing a specified amount of shift processing with respect to said held data signal.

20. A signal processing element according to claim 19, wherein said processing control circuit comprises, means for controlling the amount of shifting to be performed by said shifter.

* * * * *